(12) United States Patent
Matsuda et al.

(10) Patent No.: US 10,076,063 B2
(45) Date of Patent: *Sep. 11, 2018

(54) ELECTRONIC APPARATUS

(71) Applicant: Toshiba Memory Corporation, Minatuo-ku, Tokyo (JP)

(72) Inventors: Yoshiharu Matsuda, Kawasaki Kanagawa (JP); Kazuhiro Yoshida, Yokohama Kanagawa (JP); Kenichi Sawanaka, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 14/793,161

(22) Filed: Jul. 7, 2015

(65) Prior Publication Data

US 2016/0270261 A1 Sep. 15, 2016

Related U.S. Application Data

(60) Provisional application No. 62/131,178, filed on Mar. 10, 2015.

(51) Int. Cl.
*H05K 7/20* (2006.01)
*H05K 7/14* (2006.01)

(52) U.S. Cl.
CPC ....... *H05K 7/20445* (2013.01); *H05K 7/1427* (2013.01); *H05K 7/20409* (2013.01)

(58) Field of Classification Search
CPC ............. H05K 7/2039; H05K 7/20418; H05K 7/20409; H05K 7/20436; H05K 7/20445; H05K 7/20472; H05K 7/20481

(Continued)

(56) References Cited

U.S. PATENT DOCUMENTS 4,737,602 A * 4/1988 Yamamoto ............. H01H 15/06
200/16 C
5,734,555 A * 3/1998 McMahon ........... H05K 1/0204
257/686

(Continued)

FOREIGN PATENT DOCUMENTS

JP 2002-290087 A 10/2002
JP 2004-273907 A 9/2004

(Continued)

OTHER PUBLICATIONS

Taiwanese Office Action dated Sep. 1, 2016 in counterpart Taiwanese patent application No. 104128892 along with English translation.

*Primary Examiner* — Dion R Ferguson
*Assistant Examiner* — Amir Jalali
(74) *Attorney, Agent, or Firm* — White & Case LLP

(57) ABSTRACT

According to one embodiment, an electronic apparatus includes a first substrate, a second substrate, an electronic component, a housing, and a protruding portion. The first substrate has a first face and a second face and is provided with an opening. The second substrate has a third face configured to face the second face and a fourth face and is configured to be electrically connected to the first substrate. The electronic component is configured to be mounted on the third face and is configured to be disposed at a position overlapping the opening in a direction in which the third face faces. The housing is configured to accommodate the first and second substrates. The protruding portion is provided in the housing and is configured to pass through the opening and be thermally connected to the electronic component.

19 Claims, 10 Drawing Sheets

(58) Field of Classification Search
USPC .................. 361/709–710, 714, 717–719;
165/80.2–80.3, 185; 174/547–548
See application file for complete search history.

(56) References Cited

U.S. PATENT DOCUMENTS

| | | | | |
|---|---|---|---|---|
| 6,304,450 | B1 * | 10/2001 | Dibene, II | G06F 1/18 165/185 |
| 6,381,136 | B1 * | 4/2002 | Nelson | G06F 1/184 257/718 |
| 6,643,135 | B2 | 11/2003 | Tomioka | |
| 6,771,507 | B1 * | 8/2004 | Belady | H01L 23/4006 165/185 |
| 7,345,885 | B2 | 3/2008 | Boudreaux et al. | |
| 8,547,703 | B2 * | 10/2013 | Aoki | H01L 23/4093 174/252 |
| 9,204,548 | B2 * | 12/2015 | Ahmad | H05K 1/141 |
| 2002/0139467 | A1 | 10/2002 | Tomioka | |
| 2004/0150957 | A1 * | 8/2004 | Boudreaux | H01L 23/4006 361/719 |
| 2006/0109625 | A1 * | 5/2006 | Harris | G06F 1/184 361/695 |
| 2006/0109629 | A1 * | 5/2006 | Harris | H01L 23/433 361/704 |
| 2006/0126297 | A1 * | 6/2006 | Belady | G06F 1/189 361/700 |
| 2006/0133041 | A1 * | 6/2006 | Belady | G06F 1/20 361/704 |
| 2006/0133042 | A1 * | 6/2006 | Belady | G06F 1/189 361/704 |
| 2006/0133043 | A1 * | 6/2006 | Boudreaux | H05K 1/144 361/704 |
| 2006/0181857 | A1 * | 8/2006 | Belady | H01L 23/467 361/719 |
| 2006/0187646 | A1 * | 8/2006 | Belson | H05K 1/141 361/719 |
| 2009/0017688 | A1 * | 1/2009 | Ting | H01R 12/721 439/630 |
| 2011/0110035 | A1 * | 5/2011 | Cheng | H01L 23/467 361/690 |
| 2011/0248389 | A1 | 10/2011 | Yorita et al. | |
| 2012/0075804 | A1 * | 3/2012 | Chen | G06F 1/203 361/696 |
| 2014/0035118 | A1 * | 2/2014 | Bayerer | H01L 23/049 257/690 |
| 2014/0071614 | A1 * | 3/2014 | Kaldani | H05K 7/20 361/679.46 |
| 2014/0077354 | A1 | 3/2014 | Yamamoto et al. | |
| 2016/0205762 | A1 * | 7/2016 | Ritter | H05K 7/20409 361/720 |

FOREIGN PATENT DOCUMENTS

| | | |
|---|---|---|
| JP | 2010-103369 A | 5/2010 |
| JP | 2011-095961 A | 5/2011 |
| JP | 2014-199829 A | 10/2014 |

* cited by examiner

ELECTRONIC APPARATUS

CROSS-REFERENCE TO RELATED APPLICATIONS

This application is based upon and claims the benefit of priority from U.S. Provisional Application No. 62/131,178, filed on Mar. 10, 2015; the entire contents of which are incorporated herein by reference.

FIELD

Embodiments described herein relate generally to an electronic apparatus.

BACKGROUND

Various apparatuses have a substrate on which electronic components are mounted. When the apparatus operates, the electronic components mounted on the substrate generate heat. The electronic components may be cooled by being thermally connected to a heat sink or a housing of the apparatus, for example.

DETAILED DESCRIPTION

In general, according to one embodiment, an electronic apparatus includes a first substrate, a second substrate, an electronic component, a housing, and a protruding portion. The first substrate has a first surface and a second surface positioned on an opposite side of the first surface and is provided with an opening. The second substrate has a third surface facing the second surface and a fourth surface positioned on an opposite side of the third surface and is configured to be electrically connected to the first substrate. The electronic component is mounted on the third surface of the second substrate and is configured to be disposed at a position overlapping the opening in a direction in which the third surface faces. The housing is configured to accommodate the first and second substrates. The protruding portion is provided in the housing and is configured to pass through the opening so as to be thermally connected to the electronic component.

Hereinafter, a first embodiment will be described with reference to FIGS. 1 to 7. In the present specification, basically, the user side is defined as a front side, the side distant from the user is defined as a rear side, the left side as seen from the user is defined as a left side, the right side as seen from the user is defined as a right side, the upper side as seen from the user is defined as an upper side, and the lower side as seen from the user is defined as a lower side. Moreover, constituent elements according to the embodiment and the description of the elements are sometimes expressed in a plurality of expressions. Other expressions which are not described may be used for the constituent elements and the descriptions thereof. Moreover, other expressions may be used for a constituent element which is not expressed in a plurality of expressions and the description thereof.

Figure 1:
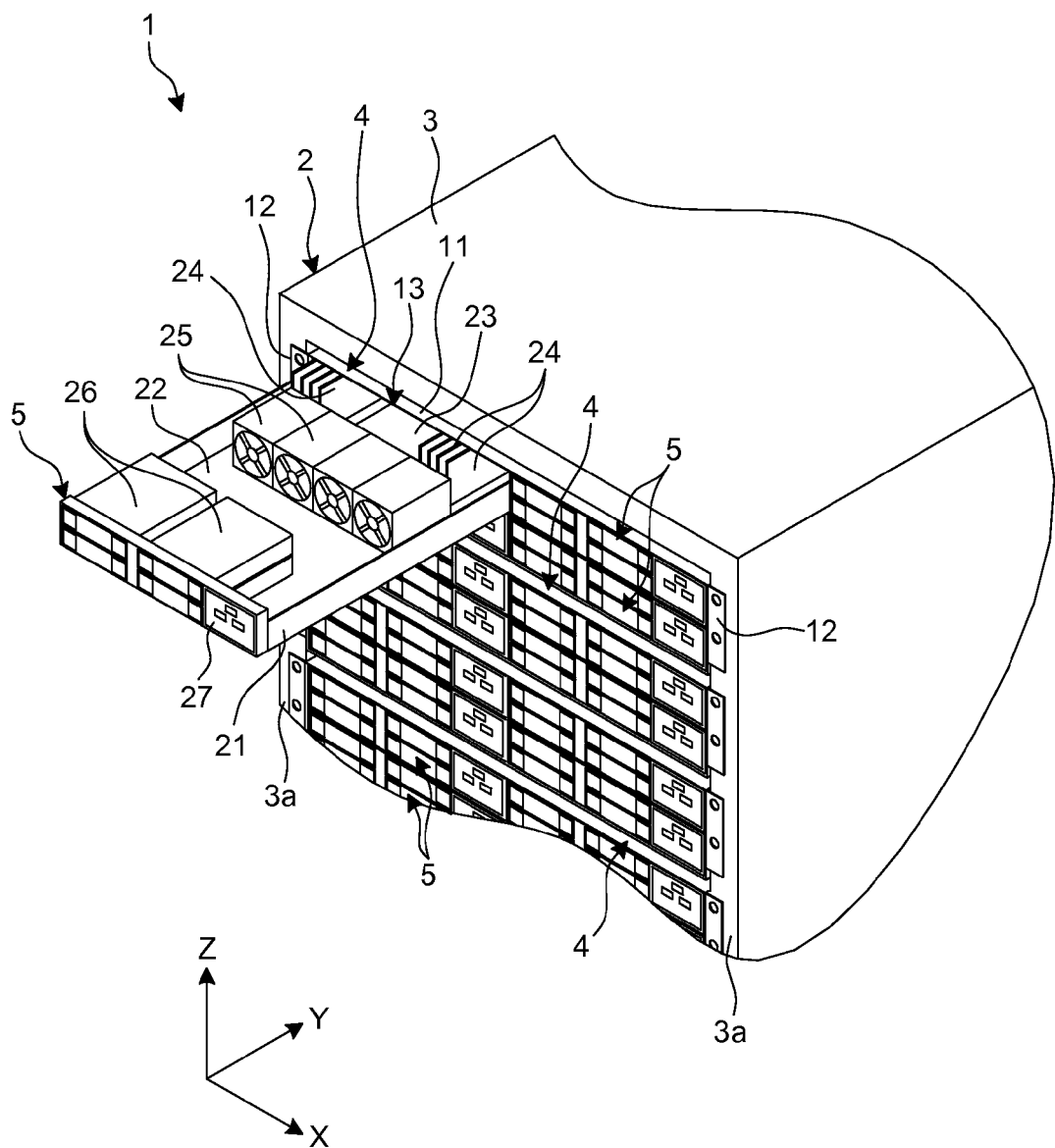
FIG. 1 is a perspective view illustrating a portion of a data center according to a first embodiment.

FIG. 1 is a perspective view illustrating a portion of a data center 1 according to the first embodiment. The data center 1 may be also referred to as a server system, a storage system, and an apparatus, for example. The data center 1 includes various apparatuses such as a plurality of server farms 2, a router, and a switching hub, and various components such as cables connecting the apparatuses. FIG. 1 illustrates one server farm 2.

As illustrated in the drawings, in the present specification, X, Y, and Z-axes are defined. The X, Y, and Z-axes are orthogonal to each other. The X-axis extends along a width of the server farm 2. The Y-axis extends along a depth of the server farm 2. The Z-axis extends along a height of the server farm 2.

The server farm 2 includes a rack 3, a plurality of module enclosures 4 and a plurality of server modules 5. The plurality of server modules 5 are stored in each of the module enclosures 4. The module enclosure 4 storing the plurality of server modules 5 therein forms a rack mountable server. The server of the data center 1 is not limited to this but another server such as a blade server may be used.

The rack 3 has two supports 3a extending in a direction along the Z-axis. A plurality of screw holes arranged in the direction along the Z-axis are provided in the support 3a. The two supports 3a are disposed so as to be separated in a direction along the X-axis. The module enclosure 4 can be inserted between the supports 3a.

The module enclosure 4 includes an enclosure case 11 and attachment members 12. The module enclosure 4 may further include a power supply unit stored in the enclosure case 11. For example, four module slots 13 are provided in the enclosure case 11.

The attachment members 12 extend toward the outer side of the enclosure case 11 from a front end of the enclosure case 11 in the direction along the X-axis. Holes corresponding to the screw holes of the support 3a are provided in the attachment members 12. The attachment members 12 are fixed to the supports 3a of the rack 3 by bolts, for example. As a result, the module enclosure 4 is attached to the rack 3.

The server module 5 can be inserted into the module slot 13 of the enclosure case 11. The server module 5 inserted into the module slot 13 can be supplied power from, for example, the power supply unit of the module enclosure 4. Power may be supplied to the server module 5 from another apparatus.

The server module 5 includes a module case 21, a module substrate 22, a central processing unit (CPU) 23, a plurality of memories 24, a plurality of fans 25, and a plurality of solid-state drives (SSDs) 26, for example. The module case 21 may be also referred to as a housing and a wall, for example. The module substrate 22 may be also referred to as a substrate, a wiring board, and a circuit board, for example. The fan 25 may be also referred to as a blowing part and a cooling apparatus, for example. The SSD 26 is an example of an electronic apparatus and may be also referred to as a storage apparatus, a storage, an electronic apparatus, an apparatus, and a component, for example. The electronic apparatus is not limited to the SSD 26 and may be another apparatus such as a hybrid hard disk drive (hybrid HDD), for example.

The module case 21 is formed in an substantially rectangular box shape of which the upper side is open and which extends in a direction along the Y-axis, for example. The shape of the module case 21 is not limited to this, but may be formed in a box shape having a closed upper side, for example. The module case 21 accommodates the module substrate 22, the CPU 23, the memories 24, the fans 25, the SSDs 26, and other components.

The module case 21 has a front panel 27. The front panel 27 is a wall provided in a front end of the module case 21. Various connectors such as a USB connector are provided in the front panel 27.

The module substrate 22 is a printed wiring board, for example. The module substrate 22 may be another substrate. The CPU 23, the memories 24, the fans 25, the SSDs 26, and the other components are mounted on the module substrate 22 directly or with another component interposed.

The fan 25 is disposed between the SSDs 26 and the CPU 23 and memories 24 in the direction along the Y-axis. When the fan 25 operates, the fan can create a flow of air in the direction along the Y-axis inside the module case 21. As a result, the fan 25 can cool the CPU 23, the memories 24, the SSDs 26, and the other components. The flow of air created by the fan 25 may be created in another direction.

The SSDs 26 are accommodated in drive cages attached to the front panel 27, for example. Without limiting to the SSDs 26, other storage apparatuses such as hard disk drives (HDDs) used together with the SSDs 26 may be accommodated in the drive cages.

Figure 2:
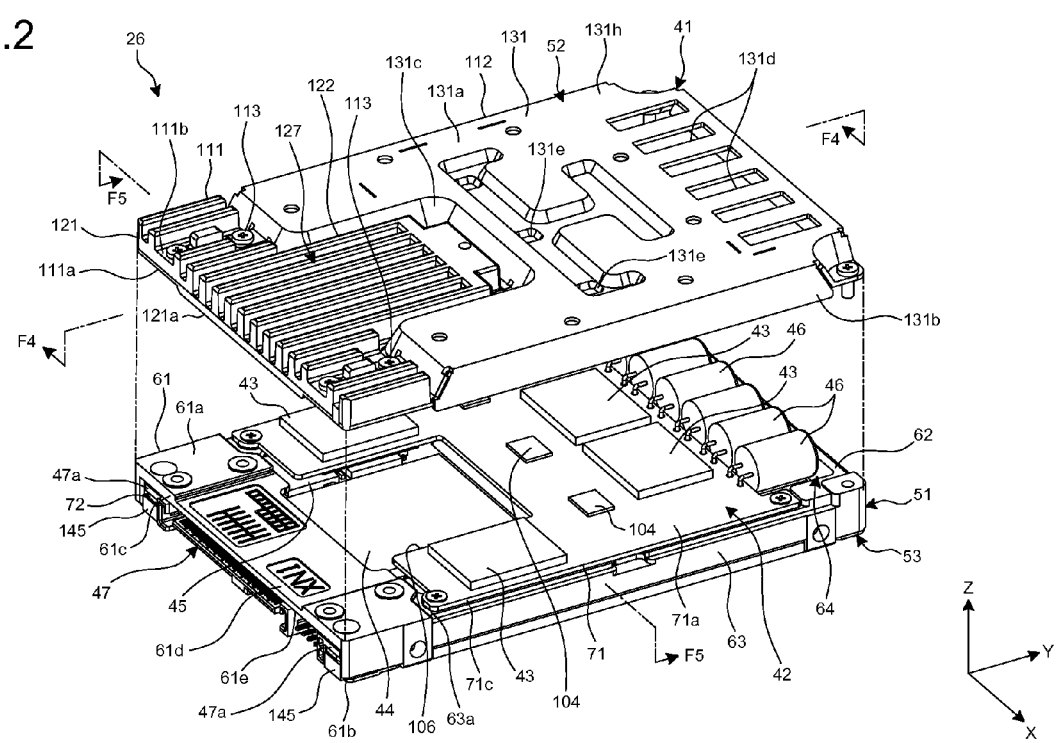
FIG. 2 is an exploded perspective view of a SSD of the first embodiment.
Figure 3:
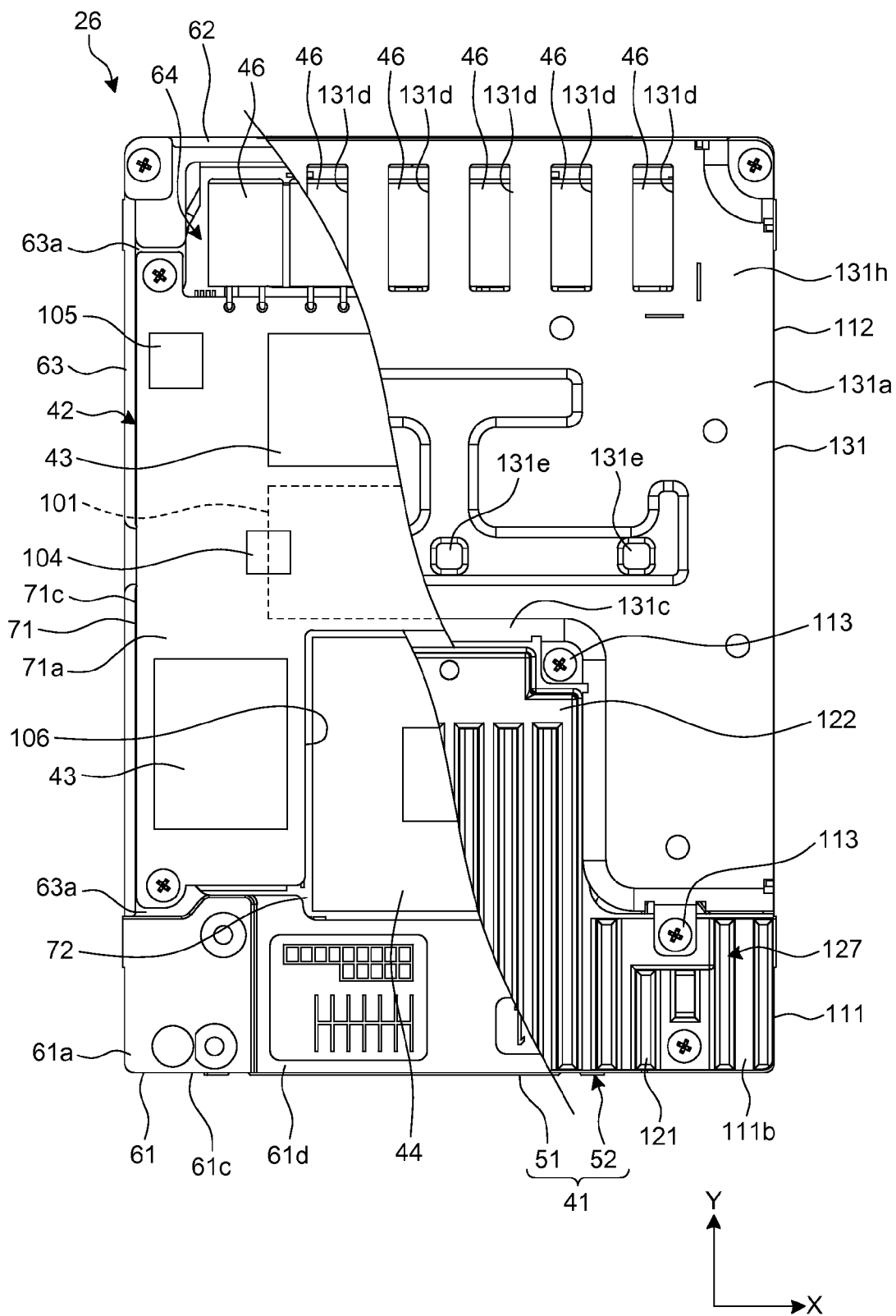
FIG. 3 is a partially cut-away plan view of the SSD of the first embodiment.

FIG. 2 is an exploded perspective view of the SSD 26 of the first embodiment. FIG. 3 is a partially cut-away plan view of the SSD 26 of the first embodiment. As illustrated in FIG. 2, the SSD 26 includes a case 41, a circuit board 42, a plurality of flash memories 43, a controller 44, a plurality of dynamic random-access memories (DRAMs) 45, a plurality of capacitors 46, and an external connector 47.

The case 41 is an example of a housing and may be also referred to as a cover, a covering portion, and a wall, for example. The circuit board 42 may be also referred to as a substrate and a wiring board, for example. The flash memory 43 is an example of a first electronic component and may be also referred to as a storing part, an element, and a component, for example. The controller 44 is an example of a second electronic component and may be also referred to as a controlling part, as element, and a component, for example. The external connector 47 may be also referred to as a connecting portion, for example.

Figure 4:
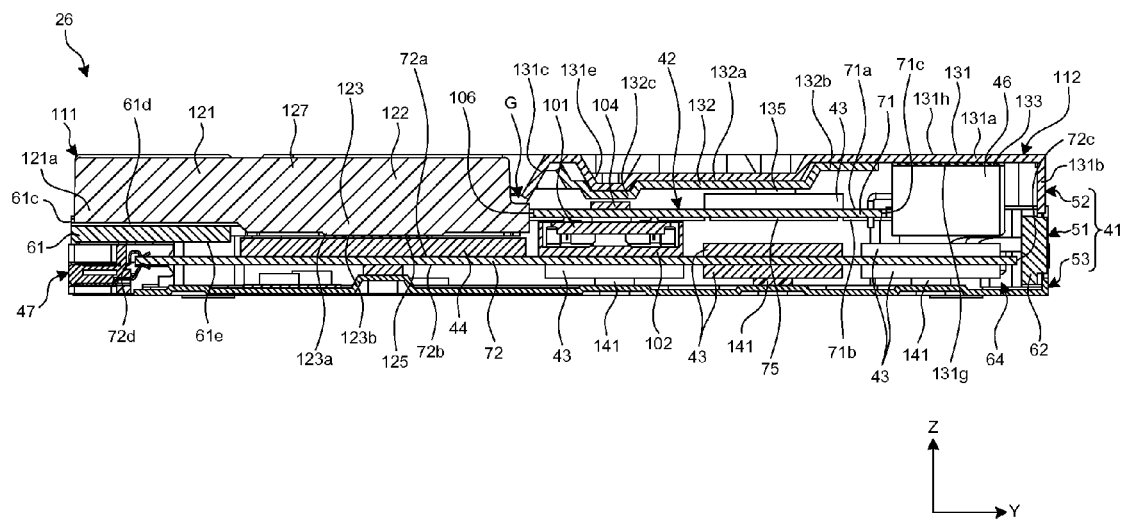
FIG. 4 is a cross-sectional view of the SSD of the first embodiment, taken along line F4-F4 in FIG. 2.
Figure 5:
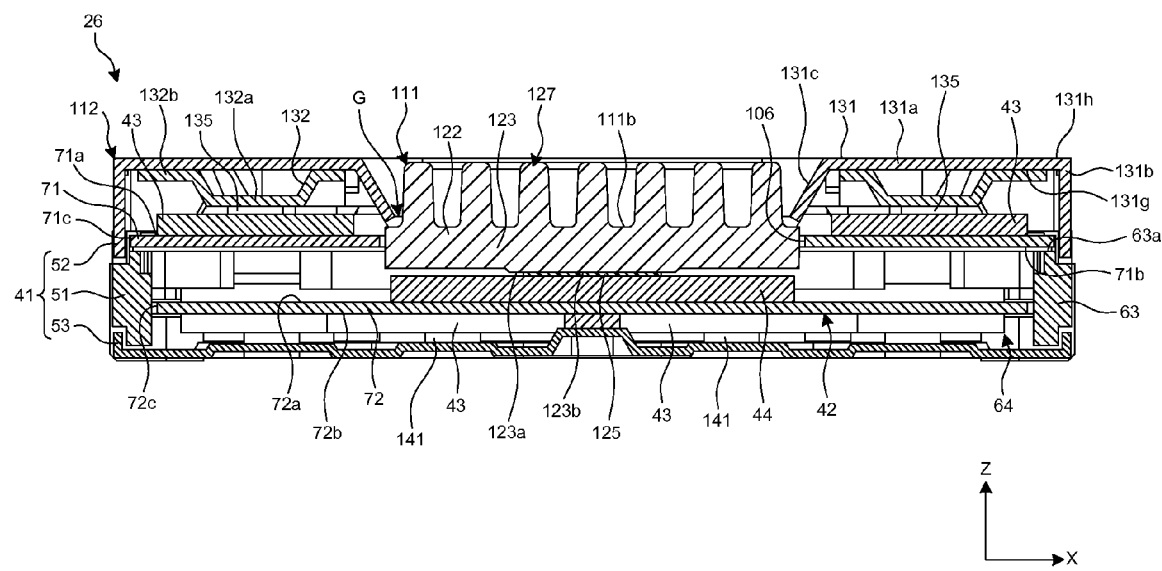
FIG. 5 is a cross-sectional view of the SSD of the first embodiment, taken along line F5-F5 in FIG. 2.

FIG. 4 is a cross-sectional view of the SSD 26 of the first embodiment, taken along line F4-F4 in FIG. 2. FIG. 5 is a cross-sectional view of the SSD 26 of the first embodiment, taken along line F5-F5 in FIG. 2. As illustrated in FIGS. 4 and 5, the case 41 includes a frame 51, a top cover 52, and a bottom cover 53. The top cover 52 is an example of a first cover and may be also referred to as a cooling portion, a heat radiating portion, a covering portion, a wall, and a member, for example. The frame 51 may be also referred to as a wall and a member, for example. The bottom cover 53 is an example of a second cover and may be also referred to as a cooling portion, a heat radiating portion, a covering portion, a wall, and a member, for example.

As illustrated in FIG. 2, the frame 51 is formed in an substantially rectangular frame shape and made of metal such as an aluminum alloy, for example. The frame 51 is not limited to this but may be formed in another shape. The frame 51 includes a first side wall 61, a second side wall 62, and two third side walls 63.

The first and second side walls 61 and 62 extend in the direction along the X-axis. The first and second side walls 61 and 62 are disposed at positions separated in the direction along the Y-axis. The first side wall 61 has an upper face 61a, a lower face 61b, and a frond end face 61c.

The upper face 61a is an substantially flat face that faces upward. A concave portion 61d is provided substantially in the central portion of the upper face 61a in the direction along the X-axis. The concave portion 61d forms a surface that is depressed from the upper face 61a and is substantially parallel to the upper face 61a. The lower face 61b is positioned on the opposite side of the upper face 61a. The frond end face 61c is formed so as to extend from an edge of the upper face 61a to an edge of the lower face 61b and forms one end portion of the frame 51 in the direction along the Y-axis. A depression portion 61e is provided in the first side wall 61. The depression portion 61e is a cut-off that is open to the lower face 61b and the frond end face 61c of the first side wall 61.

The third side walls 63 are provided between the ends of the first side wall 61 and the ends of the second side wall 62 so as to extend in the direction along the Y-axis. The two third side walls 63 are disposed at positions separated in the direction along the X-axis. An substantially flat first supporting face 63a that faces upward is provided in the third side walls 63.

An accommodating portion 64 is provided on the inner side of the first to third side walls 61, 62, and 63 of the frame 51. The accommodating portion 64 is a portion surrounded by the first to third side walls 61, 62, and 63. The circuit board 42, the flash memories 43, the controller 44, the DRAMs 45, and the capacitors 46 are accommodated in the accommodating portion 64.

The top cover 52 is attached to the frame 51 from above by screws, for example. As a result, the top cover 52 closes the accommodating portion 64 of the frame 51 from above. Further, the bottom cover 53 is attached to the frame 51 from below by screws, for example. As a result, the bottom cover 53 closes the accommodating portion 64 of the frame 51 from below.

As illustrated in FIG. 5, the circuit board 42 includes a first circuit board 71 and a second circuit board 72. The first circuit board 71 is an example of a first substrate. The second circuit board 72 is an example of a second substrate. The first and second circuit boards 71 and 72 are printed wiring boards, for example. The first and second circuit boards 71 and 72 are not limited to this but may be other types of substrates. Moreover, the SSD 26 may have only one printed wiring board and may have three or more printed wiring boards.

The first circuit board 71 has a first surface 71a, a second surface 71b, and a plurality of first end faces 71c. The first surface 71a is an example of a first face and may be also referred to as a face facing a cover, for example. The second surface 71b is an example of a second face. The first surface 71a is a substantially flat face that faces the top cover 52. The first surface 71a is covered by the top cover 52. The plurality of flash memories 43 are mounted on the first surface 71a.

The flash memory 43 is a NAND-type flash memory, for example. The first electronic component is not limited to this but may be another component such as a resistance random access memory (ReRAM) or a ferroelectric random access memory (FeRAM). The flash memory 43 can store information.

The second surface 71b is an substantially flat face that is positioned on the opposite side of the first surface 71a and faces the bottom cover 53. A portion of an end portion of the second surface 71b faces the first supporting face 63a of the third side wall 63 of the frame 51. The first circuit board 71 is attached, for example, by screws, to a portion of the first supporting face 63a of the third side wall 63, facing the end portion of the second surface 71b.

As illustrated in FIG. 4, a plurality of pads 75 are provided on the second surface 71b. The pads 75 are electrodes provided for electrical connection of the terminals of the flash memory 43 and may be also referred to as conductive portions and terminals, for example. In other words, the pads 75 are portions for mounting the flash memory 43. The flash memory 43 may be mounted on the pads 75.

The first end face 71c is provided so as to extend between an edge of the first surface 71a and an edge of the second surface 71b. The first end face 71c faces in a direction substantially orthogonal to the direction in which the first surface 71a faces (the direction along the Z-axis).

Figure 6:
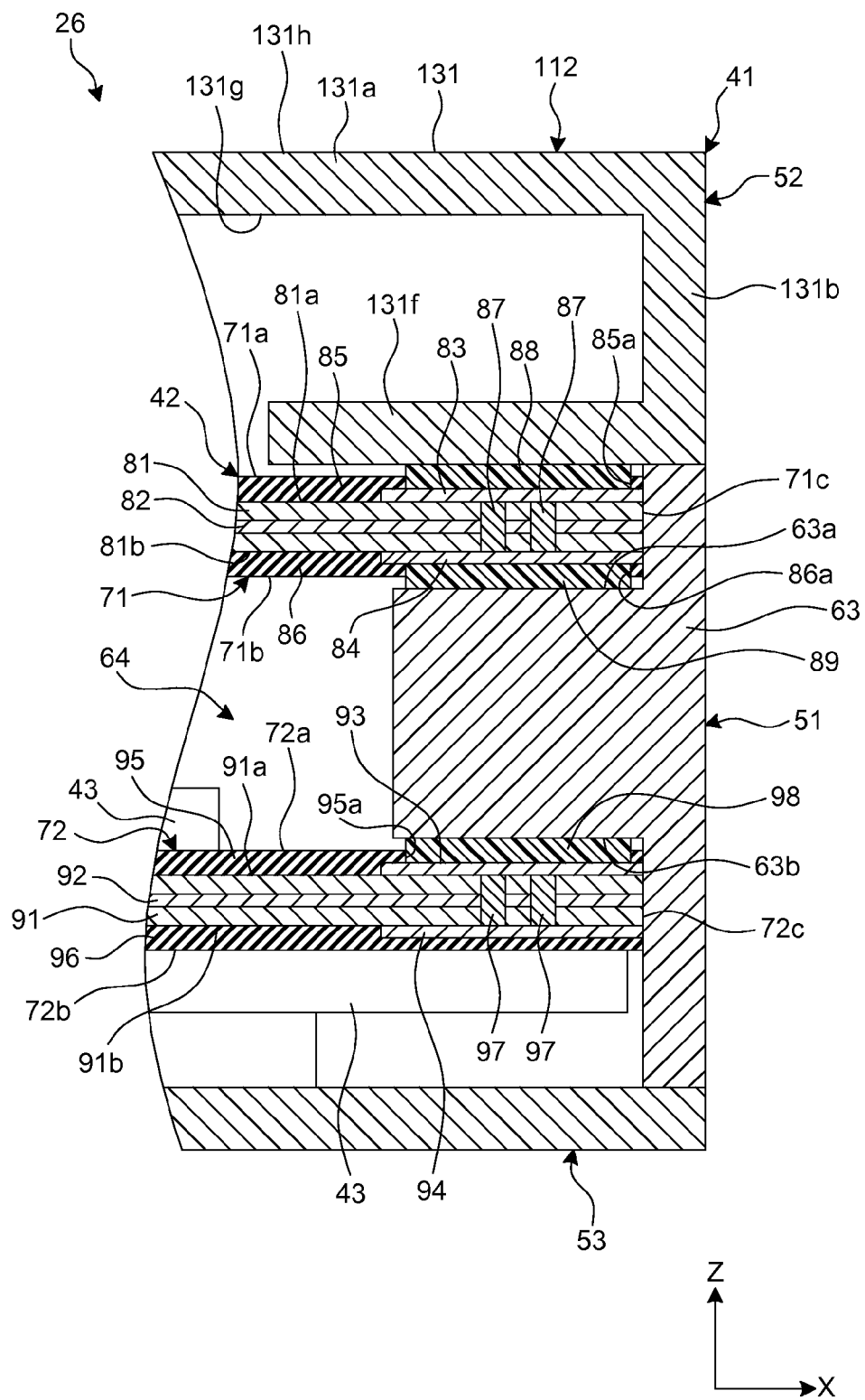
FIG. 6 is a schematic cross-sectional view illustrating a portion of the SSD of the first embodiment.

FIG. 6 is a schematic cross-sectional view of a portion of the SSD 26 of the first embodiment. As illustrated in FIG. 6, the first circuit board 71 includes a first base portion 81, a first conductor layer 82, a first conductor pattern 83, a second conductor pattern 84, a first insulating layer 85, a second insulating layer 86, and a plurality of first vias 87. The first conductor layer 82 may be also referred to as a conductive layer. The first via 87 may be also referred to as a connecting portion and a via.

The first base portion 81 is a portion on which a plurality of insulating layers and a plurality of conductor layers are stacked, for example. The conductor layers inside the first base portion 81 form a wiring, a land, and a pattern such as a solid pattern, for example. The first base portion 81 has a first formed face 81a and a second formed face 81b. The second formed face 81b is positioned on the opposite side of the first formed face 81a.

The first conductor layer 82 is provided inside the first base portion 81. Due to this, the first conductor layer 82 is positioned between the first surface 71a and the second surface 71b. The first conductor layer 82 is a so-called solid pattern and is used as the ground of the first circuit board 71. The first conductor layer 82 is not limited to the ground but may be used as a power layer, for example.

The first conductor pattern 83 is provided on the first formed face 81a of the first base portion 81. The first conductor pattern 83 forms patterns such as wirings and lands, for example. The first insulating layer 85 covers the first conductor pattern 83. The first insulating layer 85 forms at least a portion of the first surface 71a of the first circuit board 71.

A first exposing opening 85a is provided in the first insulating layer 85. The first exposing opening 85a exposes at least a portion of the first conductor pattern 83. The first conductor pattern 83 exposed by the first exposing opening 85a forms a pattern provided on the first surface 71a of the first circuit board 71. A portion of the first conductor pattern 83 exposed by the first exposing opening 85a faces the top cover 52.

At least one of the first conductor patterns 83 exposed by the first exposing opening 85a is provided in an end portion of the first surface 71a of the first circuit board 71. The end portion of the first surface 71a is a portion that extends along the first end face 71c of the first circuit board 71. For example, the end portion of the first surface 71a is a portion disposed between the first end face 71c and various electronic components such as the flash memories 43 mounted on the first surface 71a. The first conductor pattern 83 exposed by the first exposing opening 85a may be provided at another position.

The SSD 26 further includes a plurality of first heat conduction sheets 88. The first heat conduction sheet 88 may be also referred to as a heat transfer member, for example. The first heat conduction sheet 88 is interposed between the top cover 52 and the portion of the first conductor pattern 83 exposed by the first exposing opening 85a. Due to this, the first circuit board 71 supports the top cover 52 with the first heat conduction sheet 88 interposed.

The number of first heat conduction sheets 88 may be larger or smaller than the number of portions of the first conductor patterns 83 exposed by the first exposing opening 85a. For example, one first heat conduction sheet 88 may be provided over a plurality of first conductor patterns 83, and a plurality of first heat conduction sheets 88 may be attached to one first conductor pattern 83.

The first heat conduction sheet 88 thermally connects the top cover 52 and the first conductor pattern 83 exposed by the first exposing opening 85a. The first heat conduction sheet 88 has higher elasticity than the first circuit board 71 and has higher elasticity than the top cover 52. The first heat conduction sheet 88 is elastically compressed between the first circuit board 71 and the top cover 52 and is stuck to the first circuit board 71 and the top cover 52.

The second conductor pattern 84 is provided in the second formed face 81b of the first base portion 81. The second conductor pattern 84 forms patterns such as wirings and lands, for example. The second insulating layer 86 covers the second conductor pattern 84. The second insulating layer 86 forms at least a portion of the second surface 71b of the first circuit board 71.

A second exposing opening 86a is provided in the second insulating layer 86. The second exposing opening 86a exposes at least a portion of the second conductor pattern 84. The second conductor pattern 84 exposed by the second exposing opening 86a forms a pattern provided on the second surface 71b of the first circuit board 71. The portion of the second conductor pattern 84 exposed by the second exposing opening 86a faces the first supporting face 63a of the third side wall 63 of the frame 51.

At least one of the second conductor patterns 84 exposed by the second exposing opening 86a is formed in an end portion of the second surface 71b of the first circuit board 71. The end portion of the second surface 71b is a portion that extends along the first end face 71c of the first circuit board 71. For example, the end portion of the second surface 71b is a portion disposed between the first end face 71c and various electronic components mounted on the second surface 71b. The second conductor pattern 84 exposed by the second exposing opening 86a may be provided at another position.

The SSD 26 further includes a plurality of second heat conduction sheets 89. The second heat conduction sheet 89 may be also referred to as a heat transfer member, for example. The second heat conduction sheet 89 is interposed between the first supporting face 63a of the third side wall 63 and the portion of the second conductor pattern 84 exposed by the second exposing opening 86a. Due to this, the first circuit board 71 is supported by the first supporting face 63a of the third side wall 63 with the second heat conduction sheet 89 interposed.

The first supporting face 63a of the third side wall 63 of the frame 51 supports both end portions and substantially the central portion of the first circuit board 71 in the direction in which the first circuit board 71 extends (the direction along the Y-axis), for example. The frame 51 may support the other portions of the first circuit board 71.

The number of second heat conduction sheets 89 may be larger or smaller than the number of portions of the second conductor patterns 84 exposed by the second exposing opening 86a. For example, one second heat conduction sheet 89 may be provided over a plurality of second conductor patterns 84, and a plurality of second heat conduction sheets 89 may be attached to one second conductor pattern 84.

The second heat conduction sheet 89 thermally connects the frame 51 and the second conductor pattern 84 exposed by the second exposing opening 86a. The second heat conduction sheet 89 has higher elasticity than the first circuit board 71 and has higher elasticity than the frame 51. The second heat conduction sheet 89 is elastically compressed between the first circuit board 71 and the frame 51 and is stuck to the first circuit board 71 and the frame 51.

The plurality of first vias 87 are provided in the first base portion 81. The plurality of first vias 87 connect the first conductor layer 82, the first conductor pattern 83, and the second conductor pattern 84 electrically and thermally.

The flash memories 43 mounted on the first circuit board 71 overlap the first conductor layer 82 in the thickness direction of the first circuit board 71 (the direction along the Z-axis). The flash memory 43 may be disposed at another position.

The second circuit board 72 overlaps the first circuit board 71 in the direction along the Z-axis with a gap interposed. The direction along the Z-axis may be also referred to as a thickness direction of a first substrate, for example. The second circuit board 72 has a third surface 72a, a fourth surface 72b, and a second end face 72c. The third surface 72a is an example of a third face and may be also referred to as a face facing a cover, for example. The fourth surface 72b is an example of a fourth face.

The third surface 72a is an substantially flat face that faces the top cover 52. Further, the third surface 72a faces the second surface 71b of the first circuit board 71. The plurality of flash memories 43 and the controller 44, and the plurality of DRAMs 45 are mounted on the third surface 72a.

A second supporting face 63b is provided on the third side wall 63 of the frame 51. The second supporting face 63b is a substantially flat face that is positioned on the opposite side of the first supporting face 63a and faces downward. A portion of an end portion of the third surface 72a of the second circuit board 72 faces the second supporting face 63b of the third side wall 63 of the frame 51.

The second circuit board 72 is attached, for example, by screws, to a portion of the second supporting face 63b of the third side wall 63 of the frame 51, facing the end portion of the third surface 72a. The second circuit board 72 is attached to the frame 51 at a position separated from the first circuit board 71 in the direction in which the third face 72a faces (the direction along the Z-axis). That is, the frame 51 is interposed between the first circuit board 71 and the second circuit board 72.

The controller 44 is a system-on-a-chip (SoC), for example. The second electronic component is not limited to this. When the SSD 26 operates, the controller 44 generates a larger amount of heat than the flash memory 43. The controller 44 can control the plurality of flash memories 43.

The controller 44 is thicker than the flash memory 43. In other words, the length of the controller 44 is larger than the flash memory 43 in the direction in which the third surface 72a of the second circuit board 72 faces (the direction along the Z-axis). The dimensions of the flash memory 43 and the controller 44 are not limited thereto.

The fourth surface 72b is an substantially flat face that is positioned on the opposite side of the third surface 72a and faces the bottom cover 53. The fourth surface 72b is covered by the bottom cover 53. The plurality of flash memories 43 are mounted on the fourth surface 72b.

The second end face 72c is formed so as to extend between an edge of the third surface 72a and an edge of the fourth surface 72b. The second end face 72c faces in a direction substantially orthogonal to the direction in which the third surface 72a faces (the direction along the Z-axis).

As illustrated in FIG. 4, the external connector 47 is mounted on the second circuit board 72. As illustrated in FIG. 4, for example, the external connector 47 is disposed in a cut-off 72d that is provided in one end portion of the second circuit board 72 in the direction along the Y-axis. The cut-off 72d is open to the second end face 72c of the second circuit board 72. The end portion of the second circuit board 72 in which the external connector 47 is provided is located closer to the first side wall 61 than the second and third side walls 62 and 63 of the frame 51. The external connector 47 is fitted in the depression portion 61e provided in the first side wall 61 of the frame 51.

As illustrated in FIG. 2, the external connector 47 has two supporting pieces 47a. The supporting piece 47a extends in the direction along the X-axis and overlaps the second circuit board 72 in the direction along the Z-axis. The supporting piece 47a is supported on the third surface 72a of the second circuit board 72.

The external connector 47 is exposed outside the SSD 26. The external connector 47 is electrically connected to the module substrate 22 by a connector connected to the module substrate 22 of the server module 5, for example. As a result, the SSD 26 can be supplied with power from the server module 5 or the module enclosure 4 and transmit data.

As illustrated in FIG. 6, the second circuit board 72 includes a second base portion 91, a second conductor layer 92, a third conductor pattern 93, a fourth conductor pattern 94, a third insulating layer 95, a fourth insulating layer 96, and a plurality of second vias 97. The second conductor layer 92 may be also referred to as a conductive layer, for example. The second via 97 may be also referred to as a connecting portion, for example.

The second base portion 91 is a portion on which a plurality of insulating layers and a plurality of conductor layers are stacked, for example. The conductor layers inside the second base portion 91 form a wiring, a land, and a pattern such as a so-called solid pattern, for example. The second base portion 91 has a third formed face 91a and a fourth formed face 91b. The fourth formed face 91b is positioned on the opposite side of the third formed face 91a.

The second conductor layer 92 is provided inside the second base portion 91. Due to this, the second conductor layer 92 is positioned between the third surface 72a and the fourth surface 72b. The second conductor layer 92 is a so-called solid pattern and is used as the ground of the second circuit board 72. The second conductor layer 92 is not limited to the ground but may be used as a power layer, for example.

The third conductor pattern 93 is formed on the third formed face 91a of the second base portion 91. The third conductor pattern 93 forms patterns such as wirings and lands, for example. The third insulating layer 95 covers the third conductor pattern 93. The third insulating layer 95 forms at least a portion of the third surface 72*a* of the second circuit board 72.

A third exposing opening 95*a* is provided in the third insulating layer 95. The third exposing opening 95*a* exposes at least a portion of the third conductor pattern 93. The third conductor pattern 93 exposed by the third exposing opening 95*a* forms a pattern formed on the third surface 72*a* of the second circuit board 72. A portion of the third conductor pattern 93 exposed by the third exposing opening 95*a* faces the second supporting face 63*b* of the third side wall 63 of the frame 51.

At least one of the third conductor patterns 93 exposed by the third exposing opening 95*a* is provided in an end portion of the third surface 72*a* of the second circuit board 72. The end portion of the third surface 72*a* is a portion that extends along the second end face 72*c* of the second circuit board 72. For example, the end portion of the third surface 72*a* is a portion disposed between the second end face 72*c* and various electronic components such as the flash memories 43 mounted on the third surface 72*a*. The third conductor pattern 93 exposed by the third exposing opening 95*a* may be provided at another position.

The SSD 26 further includes a plurality of third heat conduction sheets 98. The third heat conduction sheet 98 may be also referred to as a heat transfer member, for example. The third heat conduction sheet 98 is interposed between the second supporting face 63*b* of the third side wall 63 and the portion of the third conductor pattern 93 exposed by the third exposing opening 95*a*. Due to this, the second circuit board 72 is supported on the second supporting face 63*b* of the third side wall 63 with the third heat conduction sheet 98 interposed.

The second supporting face 63*b* of the third side wall 63 of the frame 51 supports both end portions and substantially the central portion of the second circuit board 72 in the direction in which the second circuit board 72 extends (the direction along the Y-axis), for example. The frame 51 may support the other portions of the second circuit board 72.

The number of third heat conduction sheets 98 may be larger or smaller than the number of portions of the third conductor patterns 93 exposed by the third exposing opening 95*a*. For example, one third heat conduction sheet 98 may be provided over a plurality of third conductor patterns 93, and a plurality of third heat conduction sheets 98 may be attached to one third conductor pattern 93.

The third heat conduction sheet 98 thermally connects the frame 51 and the third conductor pattern 93 exposed by the third exposing opening 95*a*. The third heat conduction sheet 98 has higher elasticity than the second circuit board 72 and has higher elasticity than the frame 51. The third heat conduction sheet 98 is elastically compressed between the second circuit board 72 and the frame 51 and is stuck to the second circuit board 72 and the frame 51.

The fourth conductor pattern 94 is provided on the fourth formed face 91*b* of the second base portion 91. The fourth conductor pattern 94 forms patterns such as wirings and lands, for example. The fourth insulating layer 96 covers the fourth conductor pattern 94. The fourth insulating layer 96 forms at least a portion of the fourth surface 72*b* of the second circuit board 72.

A plurality of second vias 97 are provided in the second base portion 91. The plurality of second vias 97 connect the second conductor layer 92, the third conductor pattern 93, and the fourth conductor pattern 94 electrically and thermally.

The flash memories 43 and the controller 44 mounted on the second circuit board 72 overlap the second conductor layer 92 in the thickness direction of the second circuit board 72 (the direction along the Z-axis). The flash memories 43 and the controller 44 may be disposed at another position.

As illustrated in FIG. 4, the first circuit board 71 further includes a first substrate connector 101. The first substrate connector 101 is an example of a first connector and may be also referred to as a protruding portion and a connecting portion, for example. The first substrate connector 101 is mounted on the second surface 71*b* and protrudes toward the third surface 72*a* of the second circuit board 72 from the second surface 71*b*.

The second circuit board 72 further includes a second substrate connector 102. The second substrate connector 102 is an example of a second connector and may be also referred to as a protruding portion and a connecting portion, for example. The second substrate connector 102 is mounted on the third surface 72*a* and protrudes toward the second surface 71*b* of the first circuit board 71 from the third surface 72*a*.

The first substrate connector 101 is connected to the second substrate connector 102. Due to this, the first and second circuit boards 71 and 72 are connected electrically each other, and the flash memories 43 mounted on the first circuit board 71 and the controller 44 mounted on the second circuit board 72 are connected electrically. Thus, the controller 44 can control the flash memories 43 mounted on the first circuit board 71 as well as the flash memories 43 mounted on the second circuit board 72.

The first substrate connector 101 is disposed substantially in the central portion of the first circuit board 71 in the direction in which the first circuit board 71 extends (the direction along the Y-axis). Further, the second substrate connector 102 is disposed substantially in the central portion of the second circuit board 72 in the direction in which the second circuit board 72 extends (the direction along the Y-axis). Due to this, the first and second substrate connectors 101 and 102 support substantially the central portions of the first and second circuit boards 71 and 72, respectively. The first and second substrate connectors 101 and 102 may be disposed at another position.

As illustrated in FIG. 3, a plurality of electronic components 104 and 105 are further mounted on the first surface 71*a* of the first circuit board 71. The plurality of electronic components 104 and 105 are various components such as inductors, for example. Some of the plurality of electronic components 104 are disposed at a position overlapping the first substrate connector 101 in the thickness direction of the first circuit board 71 (the direction along the Z-axis). The length (thickness) of the electronic component 105 in the direction along the Z-axis is larger than the length (thickness) of the electronic component 104.

As illustrated in FIG. 4, some of the plurality of flash memories 43 mounted on the fourth surface 72*b* of the second circuit board 72 are disposed so as to overlap the second substrate connector 102 in the thickness direction of the second circuit board 72 (the direction along the Z-axis). In other words, the flash memories 43 are mounted on the fourth surface 72*b* at a position overlapping the second substrate connector 102 in the direction in which the fourth surface 72*b* faces.

An opening 106 is provided in the first circuit board 71. The opening 106 may be also referred to as an insertion portion, for example. The opening 106 is a cut-off that is open to the first end face 71*c* of the first circuit board 71, for example. The first end face 71*c* in which the opening 106 is provided is one end face of the first circuit board 71 in the direction along the Y-axis and is located closer to the first side wall 61 than the second and third side walls 62 and 63. The opening 106 is not limited to this but may be a hole or a slit, for example.

The opening 106 is provided at a position corresponding to the controller 44 mounted on the second circuit board 72. That is, the opening 106 is disposed at a position overlapping the controller 44 in the direction in which the third surface 72a of the second circuit board 72 faces (the direction along the Z-axis). The opening 106 exposes the controller 44 to the top cover 52. In other words, since the opening 106 is provided, the first circuit board 71 is formed in a region outside the region between the controller 44 and the top cover 52.

The opening 106 is larger than the controller 44. In other words, when seen in a plan view from the direction in which the third surface 72a of the second circuit board 72 faces (the direction along the Z-axis), the controller 44 is surrounded by the edges of the first circuit board 71, which form the opening 106. The size of the opening 106 is not limited to this.

The plurality of capacitors 46 are mounted on the first circuit board 71. The capacitor 46 is disposed between the first end face 71c of the first circuit board 71 and the second side wall 62 of the frame 51. The first end face 71c that faces the capacitor 46 is the other end face of the first circuit board 71 in the direction along the Y-axis. The plurality of capacitors 46 extend in the direction along the Y-axis and is arranged in the direction along the X-axis. In other words, the capacitor 46 extends in the direction crossing the thickness direction of the first circuit board 71.

The capacitor 46 is disposed at a position located further from the controller 44 than the flash memories 43. Due to this, the capacitor 46 is suppressed from being heated by the heat generated by the controller 44.

As illustrated in FIGS. 3 and 4, the top cover 52 includes a controller cover 111, a memory cover 112, and a plurality of screws 113. The controller cover 111 and the memory cover 112 may be also referred to as a cover, a heat radiating portion, a cooling portion, a covering portion, a portion, and a member, for example.

The controller cover 111 is made of an aluminum alloy, for example. The material of the controller cover 111 is not limited to this. The controller cover 111 is formed by casting, for example, and is coated with insulating black paint on the surface. The controller cover 111 is formed substantially in a T-shape and includes a first heat radiating portion 121 and a second heat radiating portion 122. The first and second heat radiating portions 121 and 122 may be also referred to as an extension portion or a portion, for example.

The first heat radiating portion 121 is formed in a planar board-like shape extending along the first side wall 61 of the frame 51. The first heat radiating portion 121 is supported on the upper face 61a of the first side wall 61. Due to this, the controller cover 111 is located closer to the external connector 47 than the memory cover 112. Further, the first heat radiating portion 121 of the controller cover 111 overlaps the external connector 47 in the thickness direction of the second circuit board 72 (the direction along the Z-axis).

The first heat radiating portion 121 has a convex portion 121a that protrudes toward the concave portion 61d of the first side wall 61. The convex portion 121a is disposed at a position corresponding to the concave portion 61d and is fitted to the concave portion 61d. Due to this, it is easy to align the controller cover 111 in relation to the frame 51.

The second heat radiating portion 122 is a portion that extends in the direction along the Y-axis from substantially the central portion in the direction along the X-axis of the first heat radiating portion 121. The length of the second heat radiating portion 122 in the direction along the X-axis is smaller than the length of the first heat radiating portion 121 in the direction along the X-axis. The length of the first and second heat radiating portions 121 and 122 is not limited to this.

The second heat radiating portion 122 covers the controller 44 on the second circuit board 72, which is exposed by the opening 106 of the first circuit board 71. The second heat radiating portion 122 may cover at least a portion of the controller 44. The second heat radiating portion 122 may further cover other components mounted on the first and second circuit boards 71 and 72.

A protruding portion 123 is provided in the second heat radiating portion 122. The protruding portion 123 protrudes toward the controller 44 mounted on the second circuit board 72 and passes through the opening 106. In other words, at least a portion of the protruding portion 123 is accommodated in the opening 106. The protruding portion 123 is separated from the edges of the first circuit board 71 that form the opening 106.

The protruding portion 123 has a contacting portion 123a. The contacting portion 123a protrudes toward the controller 44. A contacting surface 123b that faces the controller 44 is provided in the contacting portion 123a. The contacting surface 123b is a portion in which paint is removed and the material of the controller cover 111 is exposed by cutting, for example.

The SSD 26 further includes a fourth heat conduction sheet 125. The fourth heat conduction sheet 125 is an example of a first heat transfer member. The fourth heat conduction sheet 125 is interposed between the controller 44 and the contacting surface 123b of the protruding portion 123. Due to this, the controller 44 supports the controller cover 111 with the fourth heat conduction sheet 125 interposed.

The fourth heat conduction sheet 125 connects the controller 44 and the protruding portion 123 of the controller cover 111 thermally. The fourth heat conduction sheet 125 has higher elasticity than the controller cover 111 and has higher elasticity than the controller 44. The fourth heat conduction sheet 125 is elastically compressed between the controller cover 111 and the controller 44 and is stuck to the controller cover 111 and the controller 44. Further, the fourth heat conduction sheet 125 absorbs a variation in the dimension of the gap between the controller 44 and the contacting surface 123b of the protruding portion 123.

As illustrated in FIG. 2, the controller cover 111 further includes an inner face 111a and an outer face 111b. The inner face 111a faces the inner side of the SSD 26. For example, a portion of the inner face 111a formed in the second heat radiating portion 122 faces the second circuit board 72. The outer face 111b is positioned on the opposite side of the inner face 111a and faces the outer side of the SSD 26.

The controller cover 111 further includes a plurality of fins 127. The fin 127 may be also referred to as a heat radiating portion, a cooling portion, and a protruding portion, for example. The fin 127 is provided on the outer face 111b of the controller cover 111. The fin 127 is a planar plate-like portion that extends in the direction along the Y-axis. In other words, the fin 127 extends in the direction of the flow of air created by the fans 25 of the server module 5. The extension direction of the fin 127 is not limited to this.

As illustrated in FIGS. 4 and 5, the memory cover 112 includes a covering member 131, a protruding member 132, and a seal 133. The covering member 131 and the protruding member 132 are made of an aluminum alloy, for example. The material of the covering member 131 and the protruding member 132 is not limited to this.

The covering member 131 is made of a metal plate which is bent, for example. The covering member 131 may be formed by another method. The covering member 131 has a first covering portion 131a, a plurality of first edge portions 131b, and a plurality of second edge portions 131c.

The first covering portion 131a covers at least a portion of the first surface 71a of the first circuit board 71. The first covering portion 131a may further cover at least a portion of the second circuit board 72 exposed by the opening 106, for example.

As illustrated in FIG. 3, a plurality of holes 131d are provided in the first covering portion 131a. The plurality of holes 131d is provided at positions corresponding to the plurality of capacitors 46. A portion of the capacitor 46 can be inserted into the hole 131d. Due to this, the hole 131d suppresses the capacitor 46 from interfering with the first covering portion 131a.

A plurality of first projected portions 131e are provided on the first covering portion 131a. The first projected portion 131e is formed by raising, for example. The first projected portion 131e protrudes toward the first circuit board 71. The plurality of first projected portions 131e overlaps substantially the central portion of the first circuit board 71 in the direction along the Y-axis and is arranged in the direction along the X-axis. The first projected portion 131e is not limited to this.

As illustrated in FIGS. 4 and 5, the first edge portion 131b extends toward the second or third side walls 62 or 63 from an end portion of the first covering portion 131a overlapping the second or third side wall 62 or 63. The first edge portion 131b makes contact with the corresponding second or third side wall 62 or 63. As a result, the memory cover 112 is supported by the frame 51.

As illustrated in FIG. 6, an extension portion 131f is provided in a portion of the first edge portion 131b. The extension portion 131f extends in the direction along the first surface 71a of the first circuit board 71 from the first edge portion 131b. That is, the extension portion 131f is connected to the first covering portion 131a with the first edge portion 131b interposed. The extension portion 131f overlaps the first conductor pattern 83 provided in the end portion of the first circuit board 71.

The first heat conduction sheet 88 is interposed between the extension portion 131f of the memory cover 112 and the portion of the first conductor pattern 83 exposed by the first exposing opening 85a. Due to this, the first heat conduction sheet 88 connects the first conductor pattern 83 and the extension portion 131f of the memory cover 112 thermally.

As illustrated in FIG. 4, the second edge portion 131c extends toward the second heat radiating portion 122 from the end portion of the first covering portion 131a adjacent to the second heat radiating portion 122 of the controller cover 111. The distal end of the second edge portion 131c is separated by a very small distance from the second heat radiating portion 122. In other words, a gap G is formed between the controller cover 111 and a portion of the memory cover 112.

The covering member 131 further has an inner face 131g and an outer face 131h. The inner face 131g faces the inner side of the SSD 26. For example, a portion of the inner face 131g faces the first circuit board 71. The outer face 131h is positioned on the opposite side of the inner face 131g and faces the outer side of the SSD 26.

The protruding member 132 is made of a metal plate which is bent, for example. The protruding member 132 may be formed by another method. The protruding member 132 is attached to the inner face 131g of the covering member 131. The protruding member 132 has a second covering portion 132a, a fixing portion 132b, and a plurality of second projected portions 132c. The second projected portion 132c is an example of a second protruding portion and may be also referred to as a convex portion, for example.

The second covering portion 132a is disposed between the first covering portion 131a and the first circuit board 71 and covers a portion of the first circuit board 71. The second covering portion 132a covers at least some of the plurality of flash memories 43 mounted on the first surface 71a of the first circuit board 71. In other words, the second covering portion 132a faces the plurality of flash memories 43 mounted on the first surface 71a of the first circuit board 71. The second covering portion 132a is formed separately from the electronic component 105 mounted on the first surface 71a.

The fixing portion 132b extends toward the first covering portion 131a of the covering member 131 from the end portion of the second covering portion 132a. The fixing portion 132b is attached to the first covering portion 131a by caulking, for example. Due to this, the second covering portion 132a is supported at a position at which a gap is formed between the first covering portion 131a and the second covering portion 132a, and a gap is formed between the flash memory 43 and the second covering portion 132a.

The fixing portion 132b of the protruding member 132 is attached to the covering member 131 to form the memory cover 112 in a substantially box shape that forms a space between the covering member 131 and the protruding member 132. The box-shaped portion of the memory cover 112 is formed in a substantially U-shape along the second heat radiating portion 122 of the controller cover 111 when seen in a plan view from the direction along the Z-axis. That is, the box-shaped portion of the memory cover 112 has a portion that extends in the direction along the Y-axis and a portion that extends in the direction along the X-axis. Such a memory cover 112 suppresses deformation of the memory cover 112 in the Y and X-axis directions.

The second projected portion 132c is provided in the second covering portion 132a at a position corresponding to the first projected portion 131e. In other words, the second projected portion 132c overlaps the first projected portion 131e in the direction along the Z-axis.

The second projected portion 132c is formed by a raising, for example. The second projected portion 132c protrudes toward the first surface 71a of the first circuit board 71. The first projected portion 131e is fitted into the recessed portion of the second projected portion 132c. The first projected portion 131e makes contact with the second projected portion 132c and is connected to the second projected portion 132c thermally.

The convex portion of the second projected portion 132c makes contact with some of the electronic components 104 on the first circuit board 71 with an insulating heat conduction sheet interposed, for example. Due to this, the second projected portion 132c is thermally connected to the first circuit board 71 with the electronic component 104 interposed. The second projected portion 132c may make contact with the first circuit board 71 and the conductor patterns formed in the first circuit board 71, for example, without being limited to the electronic components 104.

The second projected portion 132c makes contact with the electronic components 104 disposed substantially in the central portion of the first circuit board 71 in the direction along the Y-axis. Due to this, the second projected portion 132c supports the first circuit board 71 and suppresses the first circuit board 71 from bending.

The second projected portion 132c makes contact with the electronic components 104 at a position overlapping the first and second substrate connectors 101 and 102 in the direction along the Z-axis. Due to this, the first circuit board 71 and the electronic components 104 are held between the second projected portion 132c and the first and second substrate connectors 101 and 102.

The seal 133 blocks the plurality of holes 131d of the covering member 131. Thus, the seal 133 suppresses entering of dust and moisture into the case 41 through the holes 131d. Further, the seal 133 makes contact with the plurality of capacitors 46 to support the plurality of capacitors 46. The seal 133 is interposed between the capacitor 46 and the covering member 131 and suppresses the capacitor 46 from making direct contact with the covering member 131.

The SSD 26 further includes a plurality of fifth heat conduction sheets 135. The fifth heat conduction sheet 135 is an example of a third heat transfer member. The fifth heat conduction sheet 135 is interposed between the second covering portion 132a of the protruding member 132 and the flash memory 43 mounted on the first surface 71a of the first circuit board 71. Due to this, the flash memory 43 supports the memory cover 112 with the fifth heat conduction sheet 135 interposed.

The fifth heat conduction sheet 135 connects the memory cover 112 and the flash memory 43 mounted on the first surface 71a thermally. The fifth heat conduction sheet 135 has higher elasticity than the memory cover 112 and has higher elasticity than the flash memory 43. The fifth heat conduction sheet 135 is elastically compressed between the memory cover 112 and the flash memory 43 and is stuck to the memory cover 112 and the flash memory 43. Further, the fifth heat conduction sheet 135 absorbs a variation in the dimension of the gap between the flash memory 43 and the second covering portion 132a of the protruding member 132.

As illustrated in FIG. 2, the screws 113 attach the controller cover 111 to the memory cover 112. The controller cover 111 makes contact with the memory cover 112 partially to be attached to the memory cover 112. The screws 113 further attach the controller cover 111 and the memory cover 112 attached together to the frame 51.

The bottom cover 53 is made of an aluminum alloy, for example. The bottom cover 53 is made of a metal plate which is bent, for example. The bottom cover 53 may be made of another material and may be formed by another method.

As illustrated in FIGS. 4 and 5, the bottom cover 53 covers the fourth surface 72b of the second circuit board 72 and the plurality of flash memories 43 mounted on the fourth surface 72b of the second circuit board 72. The bottom cover 53 is supported on the first to third side walls 61 to 63 of the frame 51.

The SSD 26 further includes a plurality of sixth heat conduction sheets 141. The sixth heat conduction sheet 141 is an example of a second heat transfer member. The sixth heat conduction sheet 141 is interposed between the bottom cover 53 and the flash memory 43 mounted on the fourth surface 72b. Due to this, the flash memory 43 supports the bottom cover 53 with the sixth heat conduction sheet 141 interposed.

The sixth heat conduction sheet 141 connects the bottom cover 53 and the flash memory 43 mounted on the fourth surface 72b thermally. The sixth heat conduction sheet 141 has higher elasticity than the flash memory 43 and has higher elasticity than the bottom cover 53. The sixth heat conduction sheet 141 is elastically compressed between the flash memory 43 and the bottom cover 53 and is stuck to the flash memory 43 and the bottom cover 53.

As illustrated in FIG. 2, the bottom cover 53 has edge pieces 145. The edge piece 145 protrudes toward the second circuit board 72 from one end portion of the bottom cover 53 in the direction along the Y-axis. The edge piece 145 presses the supporting piece 47a of the external connector 47 supported on the second circuit board 72 against the first side wall 61 of the frame 51. Due to this, the connector 47 and the second circuit board 72 are held between the first side wall 61 and the edge piece 145.

When the SSD 26 described above operates, the flash memories 43 and the controller 44 generate heat. The flash memories 43 and the controller 44 are cooled in the manner described below, for example. However, cooling of the flash memories 43 and the controller 44 is not limited to that described below.

The flash memory 43 mounted on the first surface 71a of the first circuit board 71 illustrated in FIG. 4 is thermally connected to the memory cover 112 with the fifth heat conduction sheet 135 interposed. Due to this, the heat generated from the flash memory 43 is transmitted to the memory cover 112 via the fifth heat conduction sheet 135.

Further, the flash memory 43 mounted on the first surface 71a of the first circuit board 71 overlaps the first conductor layer 82 of FIG. 6 in the thickness direction of the first circuit board 71 (the direction along the Z-axis). Due to this, the heat generated from the flash memory 43 is transmitted to the first and second conductor patterns 83 and 84 from the first conductor layer 82 via the first via 87. The heat transmitted to the first conductor pattern 83 is transmitted to the memory cover 112 via the first heat conduction sheet 88. The heat transmitted to the second conductor pattern 84 is transmitted to the frame 51 via the second heat conduction sheet 89.

As described above, the heat generated from the flash memory 43 mounted on the first surface 71a of the first circuit board 71 is transmitted to the memory cover 112 and the frame 51. As a result, the flash memory 43 is cooled.

The flash memory 43 mounted on the fourth surface 72b of the second circuit board 72 illustrated in FIG. 4 is thermally connected to the bottom cover 53 with the sixth heat conduction sheet 141 interposed. Due to this, the heat generated from the flash memory 43 is transmitted to the bottom cover 53 via the sixth heat conduction sheet 141.

Further, the flash memory 43 mounted on the fourth surface 72b of the second circuit board 72 overlaps the second conductor layer 92 of FIG. 6 in the thickness direction of the second circuit board 72 (the direction along the Z-axis). Due to this, the heat generated from the flash memory 43 is transmitted to the third conductor pattern 93 from the second conductor layer 92 via the second via 97. The heat transmitted to the third conductor pattern 93 is transmitted to the frame 51 via the third heat conduction sheet 98.

As described above, the heat generated from the flash memory 43 mounted on the fourth surface 72b of the second circuit board 72 is transmitted to the bottom cover 53 and the frame 51. As a result, the flash memory 43 is cooled.

The controller 44 illustrated in FIG. 4 is thermally connected to the controller cover 111 with the fourth heat conduction sheet 125 interposed. Due to this, the heat generated from the controller 44 is transmitted to the controller cover 111 via the fourth heat conduction sheet 125.

The controller 44 overlaps the second conductor layer 92 of FIG. 6 in the thickness direction of the second circuit board 72 (the direction along the Z-axis). Due to this, the heat generated from the controller 44 is transmitted to the third conductor pattern 93 from the second conductor layer 92 via the second via 97. The heat transmitted to the third conductor pattern 93 is transmitted to the frame 51 via the third heat conduction sheet 98.

As described above, the heat generated from the controller 44 is transmitted to the controller cover 111 and the frame 51. The plurality of fins 127 formed on the controller cover 111 increases the surface area of the controller cover 111. Further, the wind created by the fans 25 of the server module 5 flows along the fins 127. Thus, the controller cover 111 is cooled efficiently and the controller 44 is also cooled.

The controller 44 generates a larger amount heat than the flash memory 43. Thus, the amount of heat transmitted to the controller cover 111 may be larger than the amount of heat transmitted to the memory cover 112. However, since the gap G is formed between the controller cover 111 and a portion of the memory cover 112, the heat transmitted to the controller cover 111 is suppressed from being transmitted to the memory cover 112. Due to this, even when the temperature of the controller cover 111 is higher than the temperature of the memory cover 112, the memory cover 112 is suppressed from being heated by the controller cover 111.

Further, the second projected portion 132c of the memory cover 112 makes contact with the electronic component 104 at the position overlapping the first and second substrate connectors 101 and 102 in the direction along the Z-axis. Due to this, the heat of the second circuit board 72 is transmitted to the second projected portion 132c of the memory cover 112 via the first and second substrate connectors 101 and 102, the first circuit board 71, and the electronic component 104. As a result, the second circuit board 72 is cooled.

In the data center 1 according to the first embodiment, the flash memory 43 overlaps the first conductor layer 82 in the thickness direction of the first circuit board 71. The first conductor layer 82 is thermally connected to the first conductor pattern 83 by the first via 87 and the first conductor pattern 83 is thermally connected to the top cover 52 by the first heat conduction sheet 88. Due to this, the heat generated from the flash memory 43 is transmitted to the top cover 52 via the first conductor layer 82, the first via 87, the first conductor pattern 83, and the first heat conduction sheet 88. Thus, the heat generated from the flash memory 43 is radiated by the top cover 52 and a rise in the temperature inside the case 41 is suppressed.

The first conductor pattern 83 is formed in the end portion of the first surface 71a. The components and wirings of the first circuit board 71 may be provided at a position separated from the end portion of the first circuit board 71 rather than in the end portion of the first circuit board 71. Thus, the first conductor pattern 83 is provided in the end portion of the first surface 71a to suppress limiting the arrangement of the components and wirings of the first circuit board 71 including the flash memories 43 and the controller 44.

The top cover 52 has the extension portion 131f that is connected to the end portion of the first covering portion 131a covering the first surface 71a and extends in the direction along the first surface 71a. The extension portion 131f is thermally connected to the first conductor pattern 83 by the first heat conduction sheet 88. Due to this, it is easy to secure a large contact area between the top cover 52, the first heat conduction sheet 88, and the first conductor pattern 83, and heat can be transmitted from the first conductor pattern 83 to the top cover 52 more efficiently.

The plurality of first vias 87 connect the first conductor layer 82 and the first conductor pattern 83. That is, since a plurality of heat transmission paths is provided between the first conductor layer 82 and the first conductor pattern 83, the heat generated from the flash memory 43 can be transmitted to the top cover 52 more efficiently. Thus, the heat generated from the flash memory 43 is radiated by the top cover 52 and a rise in the temperature inside the case 41 is suppressed.

The gap G is formed between at least a portion of the controller cover 111 of the top cover 52 thermally connected to the controller 44 that generates a larger amount of heat and the memory cover 112 thermally connected to the flash memory 43. Due to this, the heat transmitted from the controller 44 to the controller cover 111 is suppressed from being transmitted to the flash memory 43 via the memory cover 112.

The controller cover 111 has the fins 127 provided on the outer face 111b. Due to this, the heat transmitted from the controller 44 to the controller cover 111 is more easily cooled by the outside air in the module case 21, and the heat of the controller cover 111 is suppressed from being transmitted to the flash memory 43 via the memory cover 112.

The fin 127 extends in the direction along the flow of air created by the fan 25. Due to this, the heat transmitted from the controller 44 to the controller cover 111 is cooled more efficiently, and the heat of the controller cover 111 is suppressed from being transmitted to the flash memory 43 via the memory cover 112.

The memory cover 112 is attached to the controller cover 111. Due to this, during assembling of the SSD 26, for example, the memory cover 112 and the controller cover 111 can be treated as an integrated member and the SSD 26 can be assembled easily.

The controller cover 111 that receives heat from the controller 44 that generates a larger amount of heat is disposed closer to the external connector 47 than the memory cover 112. Due to this, the heat of the controller cover 111 is likely to be transmitted to the module substrate 22 and the module case 21 via the external connector 47. As a result, the heat transmitted from the controller 44 to the controller cover 111 is further suppressed from being transmitted to the flash memory 43 via the memory cover 112.

The controller cover 111 overlaps the external connector 47 in the thickness direction of the circuit board 42. Due to this, the heat of the controller cover 111 is more easily transmitted to the module substrate 22 and the module case 21 via the external connector 47. As a result, the heat transmitted from the controller 44 to the controller cover 111 is further suppressed from being transmitted to the flash memory 43 via the memory cover 112.

The protruding portion 123 of the top cover 52 passes through the opening 106 of the first circuit board 71 and is thermally connected to the controller 44 that generates a larger amount of heat than the flash memory 43 by the fourth heat conduction sheet 125. The heat generated from the controller 44 is transmitted to the top cover 52 via the fourth heat conduction sheet 125. As a result, the heat generated from the controller 44 is radiated by the top cover 52. Further, the controller 44 can be mounted on the third surface 72a of the second circuit board 72. Thus, a decrease in the degree of freedom in the arrangement of the flash memories 43 and the controller 44 in the SSD 26 is suppressed and an increase in the thickness of the SSD 26 is suppressed.

The controller 44 is longer than the flash memory 43 in the direction in which the third surface 72a of the second circuit board 72 faces. The opening 106 is formed at the position overlapping the controller 44. Due to this, the first circuit board 71 is suppressed from interfering the controller 44, and limiting the distance between the first circuit board 71 and the second circuit board 72 is suppressed.

When seen in a plan view from the direction in which the third surface 72a faces, the controller 44 is surrounded by the edges of the first circuit board 71, which form the opening 106. Thus, the first circuit board 71 is suppressed from interfering the controller 44 and limiting the distance between the first circuit board 71 and the second circuit board 72 is suppressed.

At least one of the flash memories 43 is thermally connected to the bottom cover 53 by the sixth heat conduction sheet 141. The heat generated from the flash memory 43 is transmitted to the bottom cover 53. As a result, the heat generated from the flash memory 43 is radiated by the bottom cover 53.

The fifth heat conduction sheet 135 connects the flash memory 43 and the case 41 thermally. As a result, the heat generated from the flash memory 43 is also radiated by the case 41.

The first and second circuit boards 71 and 72 are attached to the frame 51 and the top cover 52 is also attached to the frame 51. Due to this, when external force is applied to the top cover 52, deformation of the first and second circuit boards 71 and 72 is suppressed.

Some of the plurality of flash memories 43 mounted on the first circuit board 71 are adjacent to the controller 44 in the plan view from the thickness direction of the first circuit board 71. However, since the first circuit board 71 is separated from the second circuit board 72 in the thickness direction of the first circuit board 71 (the direction along the Z-axis), the temperature of the flash memories 43 mounted on the first circuit board 71 is rarely increased by the controller 44.

The first and second substrate connectors 101 and 102 are interposed between the controller 44 and the flash memory 43 on the third surface 72a of the second circuit board 72. In other words, the first and second substrate connectors 101 and 102 separate the region in which the controller 44 is mounted from the region in which the flash memory 43 is mounted. Due to this, the heat generated from the controller 44 is suppressed from heating the flash memory 43 via the air inside the case 41.

The controller 44 is disposed closer to the external connector 47 than the flash memory 43. Further, the controller cover 111 is disposed closer to the external connector 47 than the memory cover 112. That is, portions of which the temperature is more likely to increase are disposed at positions close to the external connector 47. Thus, the heat generated from the controller 44, for example, is suppressed from being transmitted to the flash memory 43 by being transmitted to the module case 21 via the external connector 47.

The plurality of capacitors 46 extend in the direction in which the first circuit board 71 extends (the direction along the Y-axis). Due to this, it is easy to further decrease the thickness of the SSD 26 (the length in the direction along the Z-axis).

In the second surface 71b of the first circuit board 71, the plurality of pads 75 on which the flash memory 43 is not mounted are exposed. In this manner, the second surface 71b may be selected with the highest priority as a face on which the flash memory 43 is not mounted and the exposed pads 75 are provided among the first to fourth surfaces 71a, 71b, 72a, and 72b of the first and second circuit boards 71 and 72. Further, the third surface 72a may be selected with the next highest priority as the face on which the exposed pads 75 are provided. Since the first and fourth surfaces 71a and 72b face the outer side of the SSD 26, the first and fourth surfaces 71a and 72b are thermally connected to the case 41 easily by the fifth and sixth heat conduction sheets 135 and 141, for example. Due to this, the flash memories 43 mounted on the first and fourth surfaces 71a and 72b can be more easily cooled than the flash memories 43 mounted on the second and third surfaces 71b and 72a.

In the first embodiment, the fins 127 are provided on the outer face 111b of the controller cover 111. However, the fins 127 may be provided on at least one of the outer face 111b of the controller cover 111 and the outer face 131h of the covering member 131 of the memory cover 112 without being limited to the surface.

Figure 7:
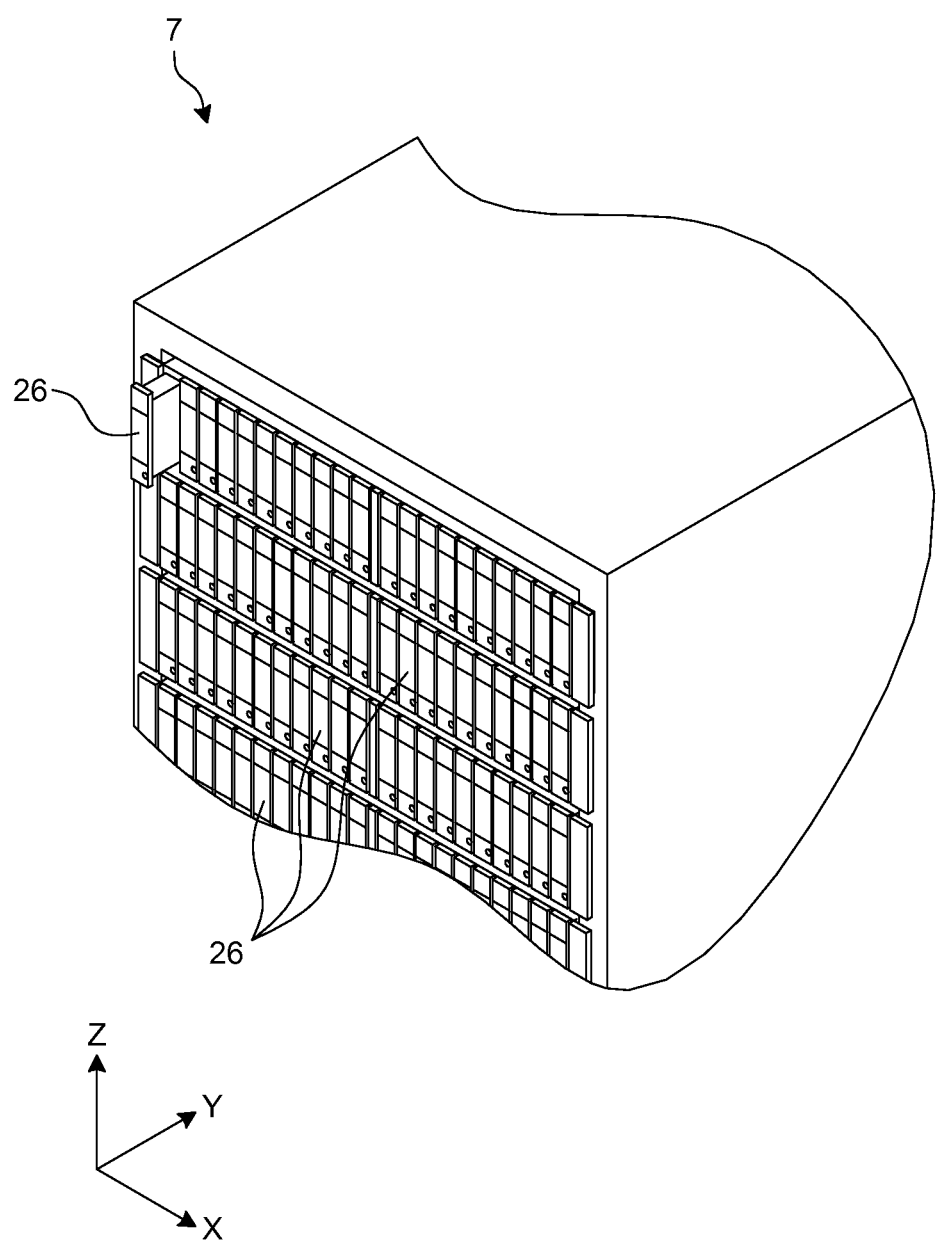
FIG. 7 is a perspective view illustrating a disk array storage as a modified example of the first embodiment.

FIG. 7 is a perspective view illustrating a disk array storage 7 as a modified example of the first embodiment. In the first embodiment, the SSD 26 is provided in the server module 5 of the data center 1. However, the SSD 26 may be provided in another system and apparatus such as the disk array storage 7.

The plurality of SSDs 26 are inserted in the disk array storage 7. The disk array storage 7 is used as an integrated storage system or storage apparatus having the plurality of SSDs 26. That is, the disk array storage 7 is a storage system having a plurality of flash memories 43 provided in each of the plurality of SSDs 26.

Hereinafter, a second embodiment will be described with reference to FIG. 8. In description of following embodiments, constituent elements having the same functions as the constituent elements that have been described already may be denoted by the same reference numerals as the already-described constituent elements, and description thereof may be omitted. Moreover, a plurality of constituent elements denoted by the same reference numeral may not have the same functions and properties but may have different functions and properties depending on the respective embodiments.

Figure 8:
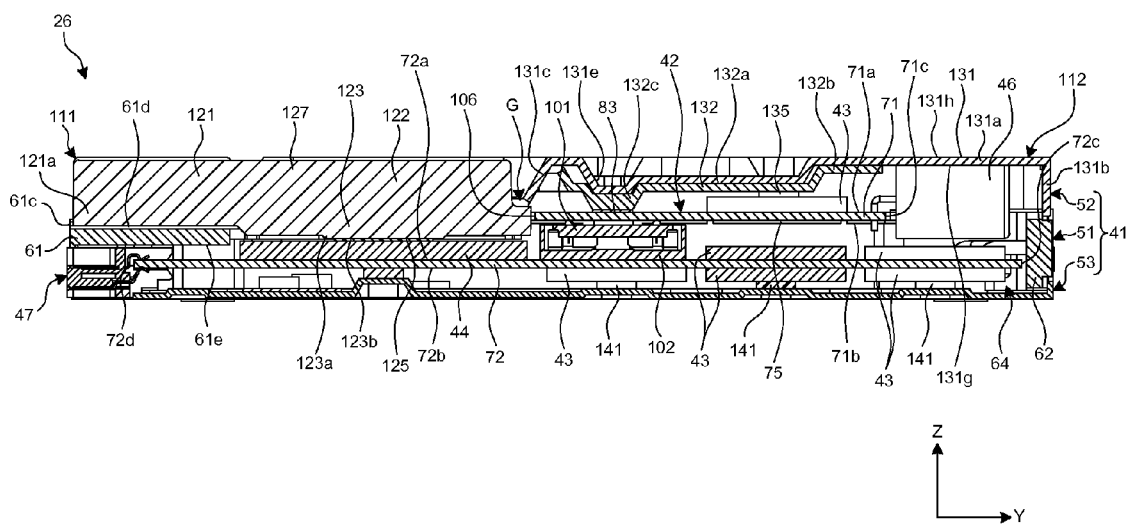
FIG. 8 is a cross-sectional view illustrating a SSD according to a second embodiment.

FIG. 8 is a cross-sectional view illustrating the SSD 26 according to the second embodiment. As illustrated in FIG. 8, the first conductor pattern 83 of the first circuit board 71 of the second embodiment is provided substantially in the central portion of the first surface 71a. The first conductor pattern 83 is formed at a position overlapping the first substrate connector 101 in the thickness direction of the first circuit board 71.

The second projected portion 132c of the protruding member 132 of the memory cover 112 makes contact with the first conductor pattern 83 provided substantially in the central portion of the first surface 71a with an insulating heat conduction sheet interposed, for example. In other words, the second projected portion 132c is thermally connected to the position of the first surface 71a overlapping the first substrate connector 101 in the direction in which the first surface 71a faces (the direction along the Z-axis).

In the SSD 26 of the second embodiment, the first conductor pattern 83 is provided at the position overlapping the first substrate connector 101 that connects the first circuit board 71 to the second circuit board 72 in the thickness direction of the first circuit board 71. Due to this, the heat of the second circuit board 72 is transmitted to the first circuit board 71 via the first and second substrate connectors 101 and 102. The heat transmitted to the first circuit board 71 is transmitted to the top cover 52 from the first conductor layer 82 via the first conductor pattern 83. As a result, the heat generated from the second circuit board 72 is radiated by the top cover 52, and a rise in the temperature inside the case 41 is suppressed.

The second projected portion 132c of the case 41 is thermally connected to the position of the first surface 71a overlapping the first substrate connector 101 in the direction in which the first surface 71a faces. Due to this, the heat generated from the controller 44 is transmitted to the second projected portion 132c via the second circuit board 72, the second substrate connector 102, the first substrate connector 101, and the first circuit board 71. As a result, the heat generated from the controller 44 is radiated by the case 41 via the first and second substrate connectors 101 and 102.

The first circuit board 71 and the first substrate connector 101 are held between the second projected portion 132c and the second substrate connector 102. As a result, the first circuit board 71 is suppressed from bending at the position at which the first substrate connector 101 is disposed.

The first substrate connector 101 is disposed substantially in the central portion of the first circuit board 71 in the direction in which the first circuit board 71 extends. The first substrate connector 101 and the first circuit board 71 are held between the second projected portion 132c and the second substrate connector 102. That is, substantially the central portion of the first circuit board 71 is held. Therefore, bending of the first circuit board 71 is further suppressed. Further, a each length of wiring between the plurality of flash memories 43 mounted on the first and second circuit boards 71 and 72 and the controller 44 mounted on the second circuit board 72 is suppressed from varying greatly.

At least one of the flash memories 43 is mounted at the position of the fourth surface 72b of the second circuit board 72 overlapping the second substrate connector 102 in the direction in which the fourth surface 72b faces. Due to this, the heat generated from the flash memory 43 is transmitted to the second projected portion 132c via the second circuit board 72, the second substrate connector 102, the first substrate connector 101, and the first circuit board 71. As a result, the heat generated from the flash memory 43 is radiated by the case 41 via the first and second substrate connectors 101 and 102.

Figure 9:
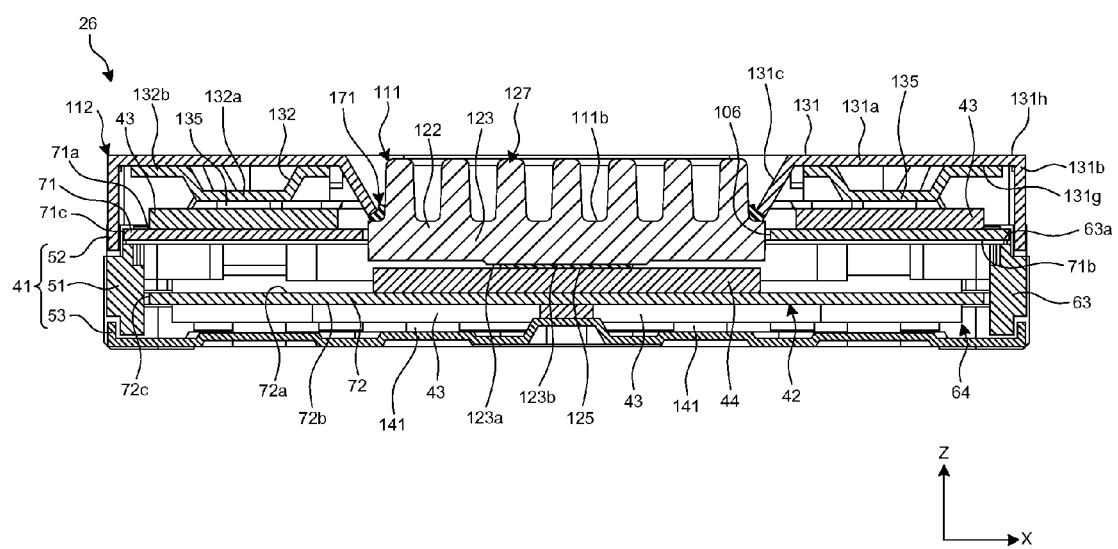
FIG. 9 is a cross-sectional view illustrating a SSD according to a third embodiment.

Hereinafter, a third embodiment will be described with reference to FIG. 9. FIG. 9 is a cross-sectional view illustrating the SSD 26 according to the third embodiment. As illustrated in FIG. 9, the top cover 52 of the third embodiment includes the controller cover 111, the memory cover 112, and a heat insulating material 171. The heat insulating material 171 may be also referred to as an interposed portion, an intermediate portion, an isolating portion, a sealing portion, a portion, and a member, for example.

The heat insulating material 171 is made of a synthetic resin, for example. The heat insulating material 171 is not limited to this, and for example, may be made of another material such as ceramics. A heat conductivity of the heat insulating material 171 is lower than a heat conductivity of the controller cover 111. Further, the heat conductivity of the heat insulating material 171 is lower than the heat conductivity of the memory cover 112.

The heat insulating material 171 is interposed between the controller cover 111 and the memory cover 112. For example, the heat insulating material 171 is interposed between the outer face 111b of the controller cover 111 and the second edge portion 131c of the memory cover 112 and closes the gap G between the controller cover 111 and the memory cover 112. The heat insulating material 171 may be attached to the controller cover 111 and the memory cover 112 by a heat insulating adhesive, for example, and may be fixed to the controller cover 111 and the memory cover 112 by the screws 113.

In the SSD 26 of the third embodiment, the heat insulating material 171 having a lower heat conductivity than the memory cover 112 and the controller cover 111 is interposed between the memory cover 112 and the controller cover 111. Due to this, the heat transmitted from the controller 44 to the controller cover 111 is further suppressed from being transmitted to the flash memory 43 via the memory cover 112.

Figure 10:
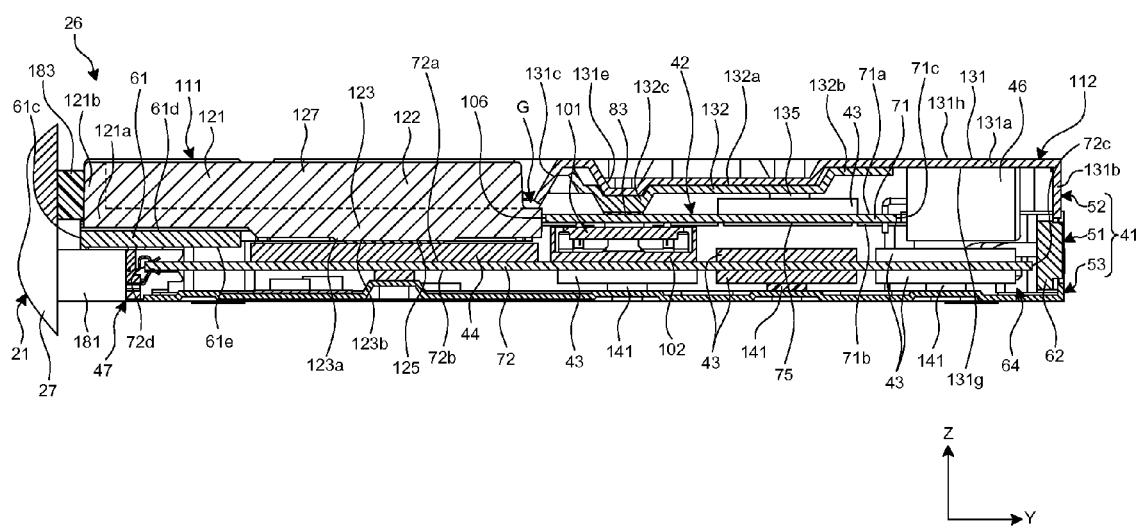
FIG. 10 is a cross-sectional view illustrating a SSD according to a fourth embodiment.

Hereinafter, a fourth embodiment will be described with reference to FIG. 10. FIG. 10 is a cross-sectional view illustrating the SSD 26 according to the fourth embodiment. As illustrated in FIG. 10, the first heat radiating portion 121 of the controller cover 111 of the fourth embodiment has a thermal connecting portion 121b.

The thermal connecting portion 121b is provided in one end portion of the first heat radiating portion 121 in the direction along the Y-axis. The end portion of the first heat radiating portion 121 in which the thermal connecting portion 121b is provided faces the same direction as the direction in which the external connector 47 faces. The arrangement of the thermal connecting portion 121b is not limited to this.

The external connector 47 of the SSD 26 is connected to a module connector 181 that is provided in the front panel 27 of the module case 21, for example. The SSD 26 connected to the module connector 181 is supported by the module connector 181 and a supporting portion provided in the module case 21, for example.

The thermal connecting portion 121b of the first heat radiating portion 121 extends along the front panel 27. A seventh heat conduction sheet 183 is interposed between the thermal connecting portion 121b and the front panel 27. The seventh heat conduction sheet 183 may be also referred to as a heat transfer member, for example. The seventh heat conduction sheet 183 connects the thermal connecting portion 121b of the controller cover 111 and the front panel 27 of the module case 21 thermally. The seventh heat conduction sheet 183 has higher elasticity than the controller cover 111 and has higher elasticity than the front panel 27. The seventh heat conduction sheet 183 is elastically compressed between the controller cover 111 and the front panel 27 and is stuck to the controller cover 111 and the front panel 27.

In the data center 1 of the fourth embodiment, the controller cover 111 of the case 41 of the SSD 26 is thermally connected to the module case 21 of the data center 1. Due to this, the heat transmitted from the controller 44 to the controller cover 111 is easily cooled by the outside air of the server module 5 via the module case 21, and the heat of the controller cover 111 is suppressed from being transmitted to the flash memory 43 via the memory cover 112.

According to at least one embodiment described hereinabove, a protruding portion provided in a housing is configured to pass through an opening provided in a first substrate so as to be thermally connected to an electronic component mounted on a second substrate. Due to this, the heat generated from the electronic component is radiated by a portion of the housing, which covers the first substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a first substrate comprising a first face and a second face on an opposite side of the first face and provided with an opening;
a second substrate comprising a third face configured to face the second face and a fourth face on an opposite side of the third face and configured to be electrically connected to the first substrate;
at least one first electronic component configured to be mounted on at least one of the first and second substrates and store information;
a second electronic component configured to be mounted on the third face of the second substrate, control the first electronic components, and be disposed at a position overlapping the opening in a direction in which the third face faces;
a housing configured to accommodate the first and second substrates and comprising a first cover configured to cover the first face of the first substrate;
a first protruding portion provided on the first cover and configured to protrude toward the second electronic component and pass through the opening; and
a first heat transfer member configured to be interposed between the first protruding portion and the second electronic component and connect the first protruding portion and the second electronic component thermally, wherein
the first cover includes a first portion, a second portion, and a fin, the first portion that covers the at least one first electronic component, the second portion that is separate from the first portion and covers the second electronic component, the fin provided on the second portion,
the first protruding portion is provided on the second portion and protrudes in an opposite direction to a direction where the fin protrudes,
the opening is a cutout that is open in an end face of the first substrate,
the end face faces in a first direction,
the second portion includes a first heat radiating portion and a second heat radiating portion,
the first heat radiating portion extends in a second direction intersecting with the first direction,
the second heat radiating portion extends from the first portion in the first direction and covers the second electronic component, and
the first protruding portion is provided on the second heat radiating portion.

2. The electronic apparatus of claim 1, wherein
when seen in a plan view from the direction in which the third face faces, the second electronic component is configured to be surrounded by edges of the first substrate, which form the opening.

3. The electronic apparatus of claim 2, further comprising a second heat transfer member, wherein
the housing further includes a second cover configured to cover the fourth face of the second substrate,
at least one of the first electronic components is configured to be mounted on the fourth face of the second substrate, and
the second heat transfer member is configured to connect the second cover and the at least one of the first electronic components mounted on the fourth face thermally.

4. The electronic apparatus of claim 3, further comprising a third heat transfer member, wherein
at least one of the first electronic components is configured to be mounted on the first face of the first substrate, and
the third heat transfer member is configured to connect the first portion and the at least one of the first electronic components mounted on the first face thermally.

5. The electronic apparatus of claim 4, further comprising:
a first connector mounted on the second face of the first substrate and configured to protrude toward the third face of the second substrate;
a second connector mounted on the third face of the second substrate and configured to protrude toward the second face of the first substrate, be connected to the first connector, and connect the first and second substrates electrically; and
a second protruding portion provided in the first portion and configured to protrude toward the first face of the first substrate and be thermally connected to a position of the first face overlapping the first connector in a direction in which the first face faces.

6. The electronic apparatus of claim 5, wherein
the first substrate and the first connector are configured to be held between the second protruding portion and the second connector.

7. The electronic apparatus of claim 6, wherein
the first connector is configured to be disposed in a central portion of the first substrate in a direction in which the first substrate extends.

8. The electronic apparatus of claim 7, wherein
at least one of the first electronic components is configured to be mounted at a position of the fourth face of the second substrate overlapping the second connector in a direction in which the fourth face faces.

9. The electronic apparatus of claim 8, wherein
the housing comprises a frame,
the first substrate is configured to be attached to the frame,
the second substrate is configured to be attached to the frame at a position separated from the first substrate in the direction in which the third face faces, and
the first cover is configured to be attached to the frame.

10. The electronic apparatus of claim 9, wherein
the frame includes a fifth face supporting the first heat radiating portion.

11. The electronic apparatus of claim 10, wherein
the frame is provided with a concave portion on the fifth face,
the first heat radiating portion includes a convex portion protruding toward the concave portion,
the convex portion is fitted to the concave portion.

12. The electronic apparatus of claim 1, wherein
the housing comprises a frame,
the first substrate is configured to be attached to the frame,
the second substrate is configured to be attached to the frame at a position separated from the first substrate in the direction in which the third face faces, and
the first cover is configured to be attached to the frame.

13. The electronic apparatus of claim 12, wherein
the frame includes a fifth face supporting the first heat radiating portion.

14. The electronic apparatus of claim 13, wherein
the frame is provided with a concave portion on the fifth face,
the first heat radiating portion includes a convex portion protruding toward the concave portion,
the convex portion is fitted to the concave portion.

15. The electronic apparatus of claim 1, wherein
the housing is provided with a gap between the first portion and the second portion.

16. The electronic apparatus of claim 1, wherein
the second electronic component is longer than the first electronic components in the direction in which the third face of the second substrate faces.

17. The electronic apparatus of claim 1, wherein
the housing further includes a second cover configured to cover the fourth face of the second substrate, and
the second cover is configured to be thermally connected to a position of the fourth face overlapping the second electronic component in a direction in which the third face faces.

18. The electronic apparatus of claim 1, wherein the first heat radiating portion is away from the end face in the first direction.

19. The electronic apparatus of claim 18, wherein the first protruding portion is fitted in the opening, with an end protruding outside the opening in the first direction.

* * * * *